US007539019B2

(12) United States Patent
Wayman et al.

(10) Patent No.: US 7,539,019 B2
(45) Date of Patent: May 26, 2009

(54) APPARATUS FOR TRANSFERRING HEAT FROM A HEAT SPREADER

(75) Inventors: Michael J. Wayman, Waconia, MN (US); Michael J. Nelson, Prior Lake, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 11/831,583

(22) Filed: Jul. 31, 2007

(65) Prior Publication Data

US 2009/0034204 A1 Feb. 5, 2009

(51) Int. Cl.
*H05K 7/20* (2006.01)
*F28F 7/00* (2006.01)
*H01L 23/26* (2006.01)

(52) U.S. Cl. .................. 361/710; 361/704; 165/80.3; 165/185; 174/16.3

(58) Field of Classification Search .......... 361/704, 361/709–710; 165/80.3, 104.33, 185; 174/16.3
See application file for complete search history.

(56) References Cited

U.S. PATENT DOCUMENTS

| 5,863,467 | A | 1/1999 | Mariner et al. |
| 5,958,572 | A | 9/1999 | Schmidt et al. |
| 6,131,651 | A | 10/2000 | Richy, III |
| 6,407,922 | B1 | 6/2002 | Eckblad et al. |
| 7,053,295 | B2 * | 5/2006 | Murasawa ............... 174/377 |
| 7,176,564 | B2 | 2/2007 | Kim |
| 7,202,309 | B2 | 4/2007 | Furrer et al. |
| 7,219,721 | B2 | 5/2007 | Miyazaki et al. |
| 7,220,485 | B2 | 5/2007 | Sayir et al. |
| 7,221,860 | B2 | 5/2007 | Fujimura et al. |
| 2005/0006054 | A1 | 1/2005 | Miyazaki et al. |
| 2007/0053168 | A1 | 3/2007 | Sayir et al. |
| 2007/0062676 | A1 * | 3/2007 | Yao ........................ 165/104.33 |
| 2007/0086196 | A1 | 4/2007 | Wong |
| 2007/0107872 | A1 | 5/2007 | Mayazaki et al. |
| 2007/0108595 | A1 | 5/2007 | Refai-Ahmed |
| 2007/0257359 | A1 * | 11/2007 | Reis et al. .................... 257/723 |

OTHER PUBLICATIONS

Motesano, Mark J., "Annealed Pyrolytic Graphite", Advanced Materials & Processes, Jun. 2006.*
DTI Global Watch Misson Report, "Developments and Trends in Thermal Management Technologies—a Mission to the USA, Dec. 2006", Pera on behlf of Deparatment of Trade and Industry, Published Feb. 2007.*
"TC1050 Thermal Management Materials", GE Advanced Ceramics, Sep. 2003, pp. 1-2, Publisher: General Electric Company.
"TPG Thermal Management Material", GE Advanced Ceramics, Sep. 2003, pp. 1-2, Publisher: General Electric Company.

* cited by examiner

*Primary Examiner*—Jayprakash N Gandhi
*Assistant Examiner*—Zachary M Pape
(74) *Attorney, Agent, or Firm*—Fogg & Powers LLC

(57) ABSTRACT

An apparatus for transferring heat from a heat spreader is provided. The apparatus includes a heat dissipating member and a heat spreading member adjacent the heat dissipating member, the heat spreading member configured to spread heat laterally across the heat dissipating member, the heat spreading member defining a heat conduction plane. The apparatus also includes a base adjacent to the heat spreading member, wherein the heat spreading member is between the base and the heat dissipating member, and at least one thermal via within the heat conduction plane, the thermal via thermally coupled to the heat spreading member, the at least one thermal via thermally coupled to the heat dissipating member and the base through surface-to-surface contact.

18 Claims, 3 Drawing Sheets

APPARATUS FOR TRANSFERRING HEAT FROM A HEAT SPREADER

BACKGROUND

For many devices removing heat is essential in order to keep the device operating effectively. Often, to aid in removal of heat, a heat sink is coupled to the device. The heat sink is generally a metal component with a flat base on one side and a number of fins on the other. The flat base is coupled to the device and the fins extend out from the base. The fins increase the surface area available for heat dissipation to the surrounding environment. Often, however, heat from the electronic device does not propagate evenly from the heat generating device to all areas of the heat sink. This results in localized "hot spots" near where the heat is coupled into the heat sink. Because the heat does not adequately spread from the hot spot, some areas on the heat sink may be dissipating heat only minimally. Thus, the heat sink is not cooling up to its potential, because the heat is being dissipated from only a portion of the surface area on the heat sink.

To solve this problem, some devices use a heat spreader to aid in spreading the heat throughout the heat sink. Heat spreaders are structures that have a higher thermal conductivity than their surrounding structure. The heat spreaders are generally positioned between a heat generating device and a heat dissipating member of the heat sink, and are oriented such that heat entering the heat spreader travels lateral to the heat dissipating member. Thus, as heat enters the heat spreader, the heat is allowed to easily propagate across (lateral to the surface of) the heat dissipating member.

To effectively spread heat across a heat dissipating member, many heat spreaders are made of materials having a high thermal conductivity in one direction or plane. The high thermally conducting plane is generally oriented parallel with the heat dissipating surface, such that the heat can propagate easily lateral to the heat dissipating surface. The materials used to obtain a high planar thermal conductivity, however, often have a very low thermal conductivity in a direction normal to that plane. Thus, although the heat spreader effectively spreads heat laterally, the heat spreader does not allow good heat conduction between the adjacent heat dissipating member and the heat spreader. Vias, therefore, are generally included to aid in transferring heat between the heat spreader and the heat dissipating member. Conventional vias are metallic projections from the heat dissipating surface or from an opposing surface which extend through the heat spreader and contact the heat dissipating surface. These vias are thermally coupled to the heat spreader in the high thermal conductivity plane. Thus, heat easily propagates to the via from the heat spreader. Once the heat enters the vias, the heat can propagate up through the vias and into the rest of the heat dissipating member.

Manufacturing heat sinks having vias and heat spreaders such at those discussed above, however, often requires expensive processes which add to the cost of the heat sink. For the reasons stated above, and for other reasons stated below which will become apparent to those skilled in the art upon reading and understanding the present specification, there is a need in the art for an apparatus and method for cost effectively transferring heat from a heat spreader.

SUMMARY

An apparatus for transferring heat from a heat spreader is provided. The apparatus includes a heat dissipating member and a heat spreading member adjacent the heat dissipating member, the heat spreading member configured to spread heat laterally across the heat dissipating member, the heat spreading member defining a heat conduction plane. The apparatus also includes a base adjacent to the heat spreading member, wherein the heat spreading member is between the base and the heat dissipating member, and at least one thermal via within the heat conduction plane, the thermal via thermally coupled to the heat spreading member, the at least one thermal via thermally coupled to the heat dissipating member and the base through surface-to-surface contact.

BRIEF DESCRIPTION OF THE DRAWINGS

The present invention can be more easily understood, and further advantages and uses thereof are more readily apparent, when considered in view of the detailed description and the following figures in which.

In accordance with common practice, the various described features are not drawn to scale but are drawn to emphasize specific features relevant to the present invention.

DETAILED DESCRIPTION

In the following detailed description, reference is made to the accompanying drawings that form a part hereof, and in which is shown by way of illustration specific illustrative embodiments in which the method and system may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention provide for an apparatus that effectively transfers heat from a heat spreader. Some embodiments of the apparatus include a heat spreader between a heat dissipating member and a base. The apparatus also includes at least one thermal via which is an insert placed with a plane of the heat spreader, between the heat dissipating member and the base. The thermal via, therefore, has strong thermal coupling with the heat spreader and thermally couples with the base and the heat dissipating member through surface-to-surface contact. In one embodiment, a fastener used to secure the base to the heat dissipating member extends through an aperture in the thermal via. The fastener secures the thermal via in place and ensures solid contact between the thermal via and the heat spreading member and base.

Figure 1:
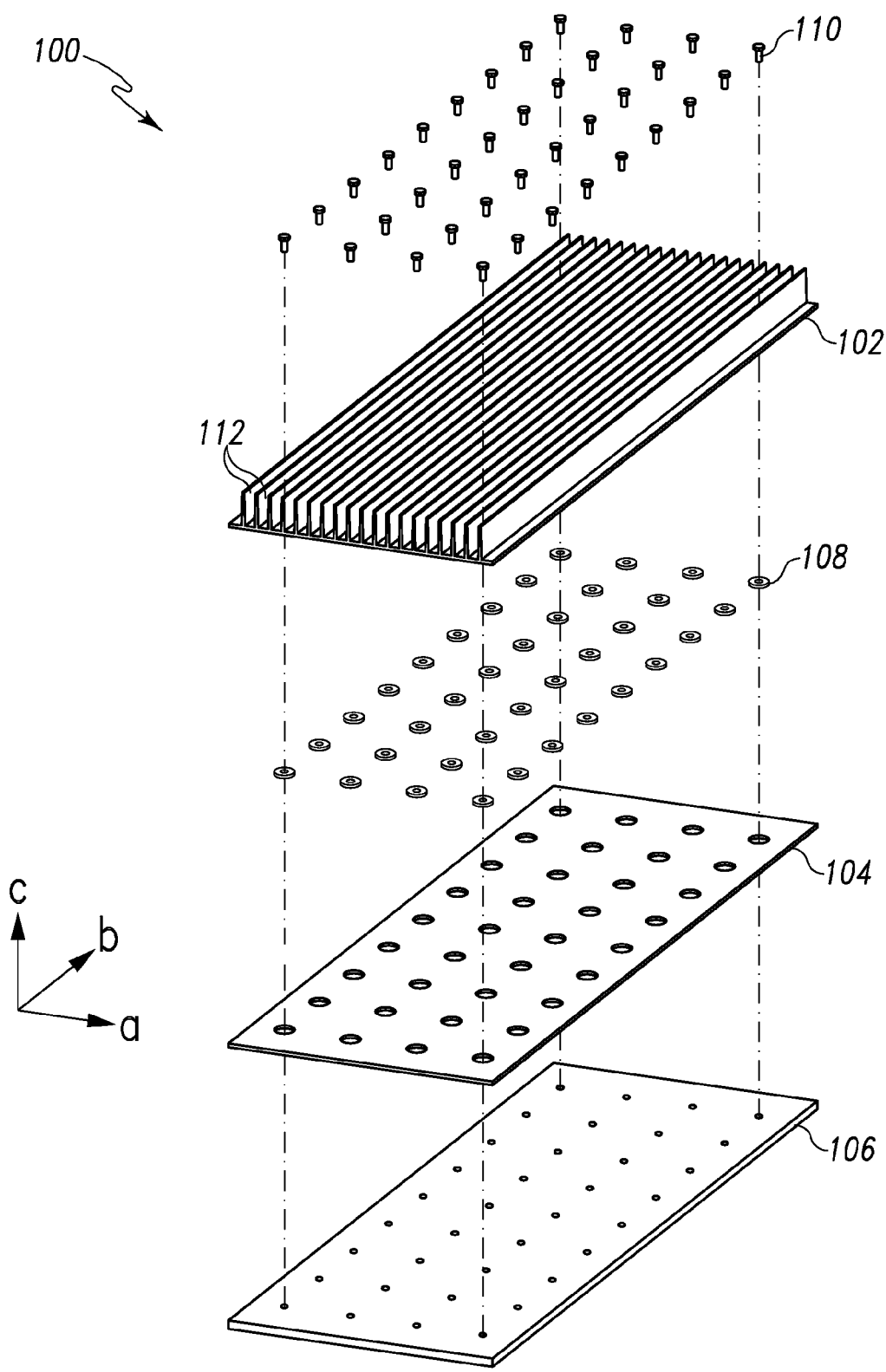
FIG. 1 is an exploded view of one embodiment of a heat sink that effectively transfers heat from a heat spreader.

FIG. 1 is an exploded view of one embodiment of a heat sink 100 that effectively transfers heat from a heat spreader. Heat sink 100 includes a heat dissipating member 102, a heat spreader 104, a base 106, and a plurality of thermal vias 108. Heat sink 100 dissipates heat from heat generating devices (not shown) to the surrounding environment. In the embodiment shown in FIG. 1, a plurality of fins 112 aid in dissipating heat from heat dissipating surface 102. In one embodiment, heat generating devices are thermally coupled to base 106. For example, in one embodiment, heat generating devices are electronic devices which are mounted to base 106. Heat from the heat generating devices propagates from base 106 through thermal vias 108 into heat spreader 104. Heat spreader 104 spreads the laterally and the heat then couples back through thermal vias 108 and into heat dissipating member 102. Heat dissipating member 104 dissipates the heat into the surrounding environment.

Base 106 and heat dissipating member 102 are composed of metal to provide adequate thermal conductivity, as well as the structural integrity necessary to support heat sink 100. For example, in one embodiment, base 106 and heat dissipating member 102 are composed of aluminum. In an alternative embodiment, finned section 102 and base 106 are composed of steel. In other embodiments, finned section 102 and/or base 106 are composed of other conductive materials or a combination of conductive materials.

Heat spreader 104 distributes heat across heat dissipating member 102. Heat spreader 104 is composed of a thermal material having a higher thermal conductivity than heat dissipating member 102, but does not posses the structural strength needed for heat sink 100 and is therefore, placed between heat dissipating member 102 and base 106 for structural integrity. Fasteners 110 hold heat dissipating member 102 to base 106 and secure heat spreader 104 between heat dissipating member 102 and base 106.

Heat spreader 104 is a material having a high thermal conductivity in a plane parallel with heat dissipating member 102. For example, in one embodiment, heat spreader 104 is composed of thermal pyrolytic graphite (TPG), which is commercially available from Momentive Performance Materials in Wilton, Connecticut. TPG may be referred to as highly oriented pyrolytic graphite (HOPG), or compression annealed pyrolytic graphite (CAPG). In any case, TPG refers to graphite materials consisting of crystallites of considerable size, the crystallites being highly aligned or oriented with respect to each other and having well ordered carbon layers or a high degree of preferred crystallite orientation, with an in-plane (a-b direction) thermal conductivity greater than 1000 W/m-K. In one embodiment, the TPG has an in-plane thermal conductivity of approximately 1,500 W/m-K. As shown in FIG. 1, the in-plane (a-b direction) of heat spreader 104 is parallel to heat dissipating member 102.

In one embodiment, TPG is formed as described in U.S. Pat. No. 5,863,467 which is hereby incorporated herein by reference. Briefly, to manufacture heat sink 100 with TPG, pyrolytic graphite is deposited between base 106 and heat dissipating member 102, and heat sink 100 is heat treated to form the pyrolytic graphite into a crystal structure. The resulting crystal structure, TPG, has a high in plane conductivity.

In a direction normal to the a-b plane however, (c-direction) heat spreader 104 has a low thermal conductivity and thus, does not propagate heat efficiently. In this embodiment, the a-b plane is parallel to heat dissipating member 102. Thus, heat spreader 104 efficiently propagates and distributes heat parallel to heat dissipating member 102, but does not efficiently propagate heat between heat dissipating member 102 and heat spreader 104.

To aid in heat propagation to and from heat dissipating member 102 and base 106, heat sink 100 includes a plurality of thermal vias 108. Thermal vias 108 are separate components from both heat dissipating member 102 and base 106. Thermal vias 108 are located between heat dissipating member 102 and base 106 within the plane of heat spreader 104. Thermal vias 108 are thermally coupled to the high heat conductive plane of heat spreader 104. Thermal vias 108 are also thermally coupled to heat dissipating member 102 and base 106. The coupling between thermal vias 108 and heat dissipating member 102 and base is by surface-to-surface contact. Unlike heat spreader 104, thermal vias 108 are composed of metal and propagate heat evenly in all directions. Thus, heat traveling laterally in heat spreader 104 travels vertically through thermal vias 108 and is coupled to heat dissipating member 102. In one embodiment, thermal vias 108 are composed of copper.

In one embodiment, each fastener 110 extends through one of the plurality of thermal vias 108. Fasteners 110 aid in securing thermal vias 108 in place and ensuring solid surface-to-surface contact between thermal vias 108 and heat dissipating member 102 and base 106. In the embodiment shown in FIG. 1, fasteners 110 are bolts. In other embodiments, fasteners 110 are rivets, screws, or other devices as known to those skilled in the art.

Figure 2A:
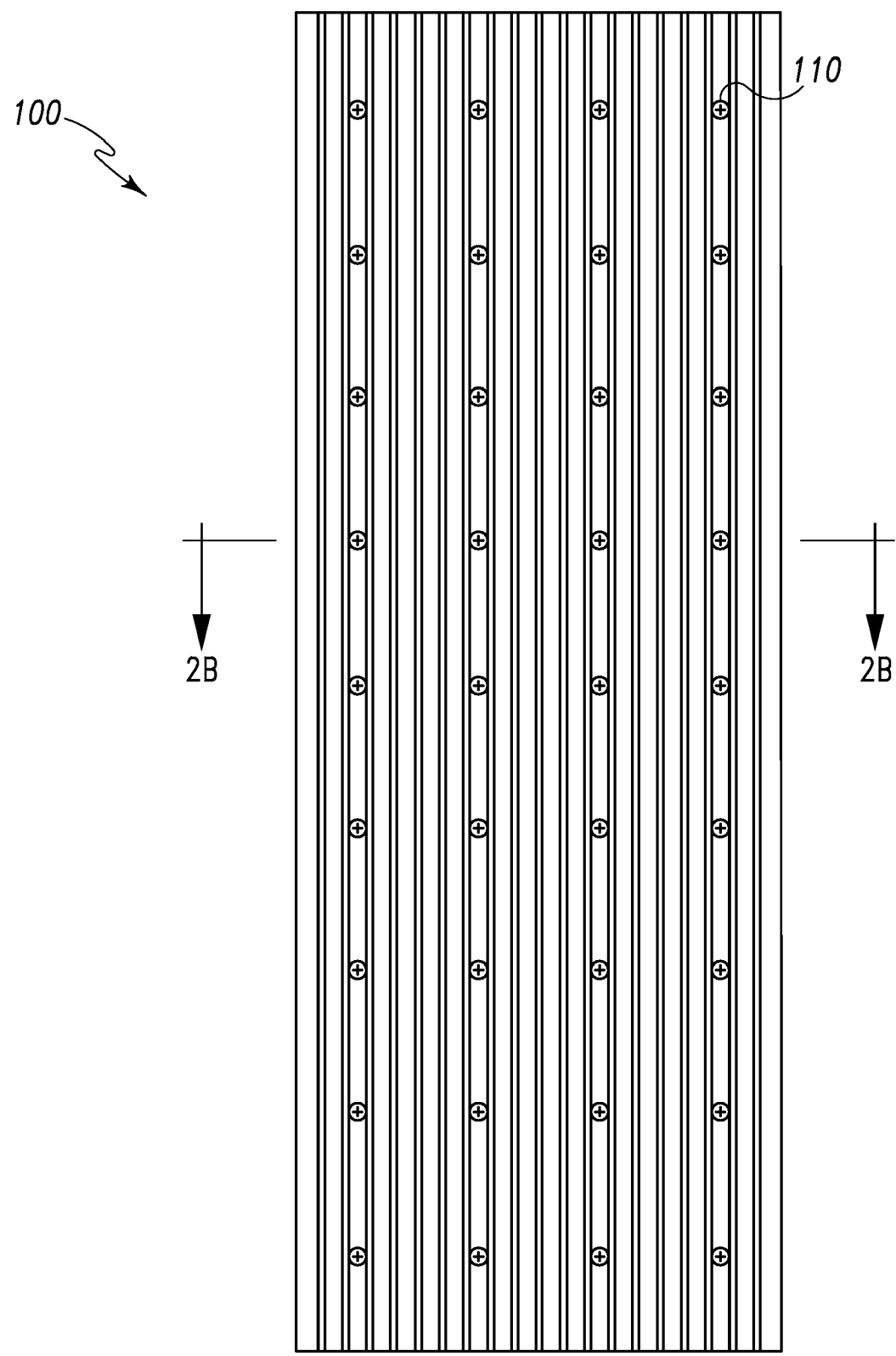
FIG. 2A is a side view of one embodiment of the heat sink of FIG. 1.
Figure 2B:
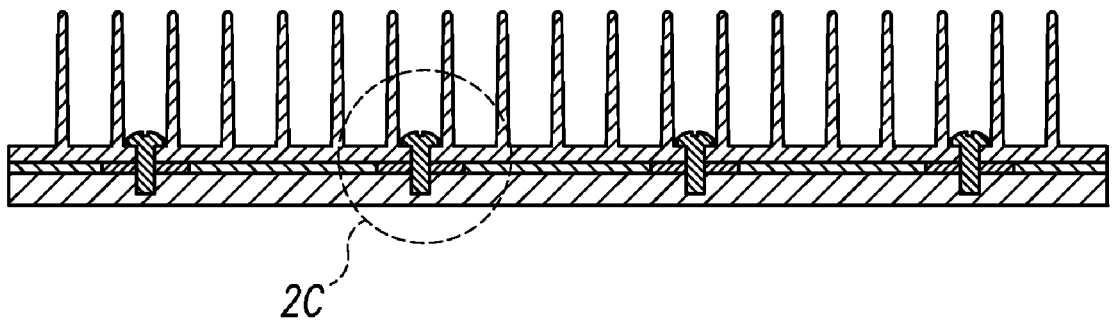
FIG. 2B is a cross-sectional view of one embodiment of the heat sink of FIG. 2A.
Figure 2C:
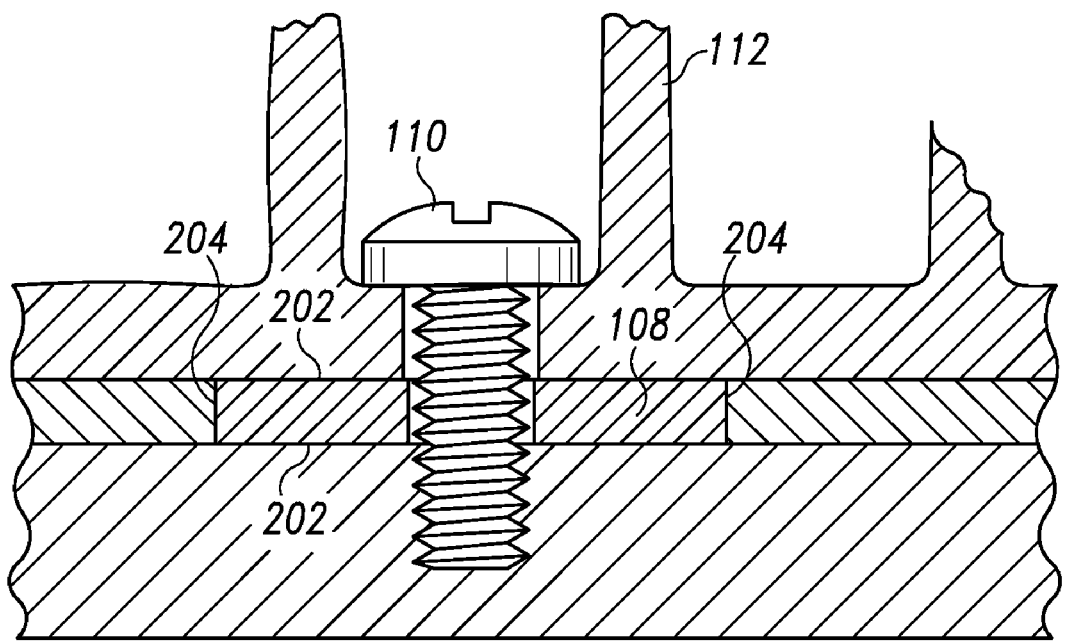
FIG. 2C is an enlarged cross-sectional view of one embodiment of the heat sink of FIG. 2B.

Referring now to FIGS. 2A, 2B, and 2C. As shown, thermal vias 108 have a washer type shape composed of an outer circular surface and an inner circular surface. The inner circular surface of each thermal via 108 is aligned such that one of the fasteners 110 is placed therethrough and into base 106. Fasteners 110 improve thermal coupling between heat dissipating member 102 and via 108 by forcing heat dissipating member 102 against via 108. Likewise, fasteners 110 improve thermal coupling between base 106 and via 108 by forcing base 106 against via 108. In order to maintain contact with both heat dissipating member 102 and base 106, thermal vias 108 are substantially similar in height to heat spreader 104.

Advantageously, positioning thermal vias 108 around fasteners 110 allows for good thermal coupling between thermal vias 108 and base 106 and thermal vias 108 and heat dissipating member 102. This is because fastener 110 provides force most effectively nearby the location of fastener 110, and thus strongly forces heat dissipating member 102 and base 106 against thermal vias 108.

In alternative embodiments, thermal vias 108 are located nearby or partially around fasteners 110, thereby providing force upon thermal vias 108. In other embodiments, thermal vias 108 are located within the plane of heat spreader 104, but away from fasteners 110 to provide heat transfer in a specific area. Additionally, although thermal vias 108 are shown as cylindrical washer shapes surrounding fasteners 110, in other embodiments, thermal vias 108 are square washer shapes, or other shapes surrounding fastener 110.

The amount of thermal energy (heat) that can transfer into/out of thermal vias 108 is dependent upon the surface are of the thermal vias 108. Thus, the area on the top and bottom surfaces 202 of thermal via controls the amount of heat transferred between thermal via 108 and heat dissipating member 102 and base 106 respectively. Thus, the size of thermal via 108 can be determined based on the amount of thermal conduction between heat dissipating member 102 and heat spreader 104. For example, if a higher thermal conduction is needed or desired for a particular application, a larger diameter thermal via 108 can be used. Likewise, if higher thermal conduction is not needed and a larger heat spreader 102 is needed or desired, a smaller diameter thermal via 108 can be used. Since the contact between thermal via 108 and heat dissipating member 102 and base 106 is metal surface-to-surface, in one embodiment, a thermal paste is applied between each of the surfaces to improve heat conduction.

Additionally, the surface area of the lateral side 204 of thermal via 108 affects the amount of heat transferred between thermal via 108 and heat spreader 104. Thus, to increase or decrease the amount of heat transfer between thermal via 108 and heat spreader 104, the lateral surface area of thermal via 108 can be increase/decreased respectively.

Advantageously, using thermal vias 108 which are separate from both heat dissipating member 102 and base 106 enables heat sink 100 to be manufactured economically. For example, as shown in FIG. 1, heat dissipating member 102 and base 106 can be formed through an extrusion process, with the only slight machining necessary to put apertures in for the fasteners 110. Conventional systems with thermal vias that are integral with one of the sides of the heat sink, however, often require that the component having the thermal vias be manufactured through a more expensive process (e.g. casting, powder metallurgy, forging), or go through a large amount of machining after an extrusion process. Thus the use of detached thermal vias 108 allows for flexible, and thus economical manufacturing of a heat sink, because the components of the heat sink can be formed through extrusion, or other process as needed or desired, and the thermal vias 108 can be added after extrusion. Additionally, the use of detached thermal vias 108 enables heat sink 100 to be easily adapted to different layouts of heat generating devices by placing thermal vias 108 in different locations. Detached thermal vias 108 also enable heat sink 100 to be adaptable to different magnitudes of thermal energy transferred by using different sized thermal vias 108.

Although specific embodiments have been illustrated and described herein, it will be appreciated by those of ordinary skill in the art that any arrangement, which is calculated to achieve the same purpose, may be substituted for the specific embodiment shown. This application is intended to base any adaptations or variations of the present invention. Therefore, it is manifestly intended that this invention be limited only by the claims and the equivalents thereof.

What is claimed is:

1. An apparatus for transferring heat from a heat spreader, the apparatus comprising:
   a heat dissipating member composed of metal;
   a heat spreader adjacent the heat dissipating member, the heat spreader having a first thermal conductivity in a plane parallel to the heat dissipating member and a second thermal conductivity in a direction normal to the plane, the first thermal conductivity being greater than a thermal conductivity of the heat dissipating member and the second thermal conductivity being less than the thermal conductivity of the heat dissipating member, the heat spreader configured to spread thermal energy across the heat dissipating member;
   a base composed of metal, the base adjacent the heat spreader, wherein the heat spreader is disposed between the base and the heat dissipating member;
   a plurality of fasteners configured to hold the base, heat spreader, and heat dissipating member together; and
   at least one thermal via surrounding one of the plurality of fasteners, the thermal via composed of metal and thermally coupled to the heat spreader and to the heat dissipating member.

2. The apparatus of claim 1, wherein the heat dissipating member is composed of aluminum.

3. The apparatus of claim 1, wherein the at least one thermal via is composed of copper.

4. The apparatus of claim 1, wherein each of the plurality of fasteners is a bolt.

5. The apparatus of claim 1, wherein the heat spreader is composed of thermal pyrolytic graphite (TPG).

6. The apparatus of claim 1, wherein the heat dissipating member further comprises a plurality of fins.

7. The apparatus of claim 1, wherein the thermal via has a shape comprising an outer circular surface and an inner circular surface.

8. The apparatus of claim 1, further comprising a thermal paste between the at least one thermal via and the heat dissipating member and a thermal paste between the at least one thermal via and the base.

9. An apparatus for transferring heat from a heat spreader, the apparatus comprising:
   a heat dissipating member;
   a heat spreading member adjacent the heat dissipating member, the heat spreading member configured to spread heat laterally across the heat dissipating member, the heat spreading member defining a heat conduction plane;
   a base adjacent to the heat spreading member, wherein the heat spreading member is between the base and the heat dissipating member;
   at least one thermal via within the heat conduction plane, the thermal via thermally coupled to the heat spreading member, the at least one thermal via thermally coupled to the heat dissipating member and the base through surface-to-surface contact;
   a thermal paste between the at least one thermal via and the heat dissipating member and a thermal paste between the at least one thermal via and the base; and
   a plurality of fasteners to hold the base, heat spreader, and heat dissipating member together;
   wherein the at least one thermal via is composed of metal, wherein the at least one thermal via is configured to have one of the plurality of fasteners positioned therethrough.

10. The apparatus of claim 9, wherein the heat dissipating surface is composed of aluminum.

11. The apparatus of claim 9, wherein the at least one thermal via is composed of copper.

12. The apparatus of claim 9, wherein the heat spreader is composed of thermal pyrolytic graphite (TPG).

13. The apparatus of claim 9, wherein the heat dissipating surface further comprises a plurality of fins.

14. The apparatus of claim 9, wherein the thermal via has a shape comprising an outer circular surface and an inner circular surface.

15. The apparatus of claim 9, wherein the heat spreading member further comprises a first thermal conductivity in a plane parallel to the heat dissipating member and a second thermal conductivity in a direction normal to the plane, the first thermal conductivity being greater than a thermal conductivity of the heat dissipating member and the second thermal conductivity being less than the thermal conductivity of the heat dissipating member.

16. An apparatus for transferring heat from a heat spreader, the apparatus comprising:
   a heat dissipating member composed of metal and having a plurality of fins;
   a sheet of thermal material, the thermal material having a first thermal conductivity in a plane parallel to the heat dissipating member and a second thermal conductivity in a direction normal to the plane, the first thermal conductivity being greater than a thermal conductivity of the heat dissipating member and the second thermal conductivity being less than the thermal conductivity of the heat dissipating member;
   a base composed of metal;
   a plurality of thermal vias having a washer shape and disposed within the sheet of thermal material, the thermal vias thermally coupled to the sheet of thermal material, and thermally coupled to the heat dissipating member and the base through surface-to-surface contact; and
   a plurality of fasteners configured to secure the base to the heat dissipating member with the sheet of thermal material between the base and the heat dissipating member, each of the plurality of fasteners configured to extend through one of the plurality of thermal vias.

17. The apparatus of claim 16, wherein the sheet of thermal material is composed of thermal pyrolytic graphite.

18. The apparatus of claim 16, wherein each of the plurality of vias is composed of copper.

* * * * *